United States Patent [19]

Koch

[11] 4,340,462
[45] Jul. 20, 1982

[54] ADJUSTABLE ELECTRODE PLASMA PROCESSING CHAMBER

[75] Inventor: George R. Koch, Los Altos, Calif.

[73] Assignee: Lam Research Corporation, Santa Clara, Calif.

[21] Appl. No.: 234,346

[22] Filed: Feb. 13, 1981

[51] Int. Cl.³ .................... C23C 15/00; C23F 1/02
[52] U.S. Cl. .................... 204/298; 204/192 E; 156/345; 156/643
[58] Field of Search .................... 204/192 R, 298; 156/345, 643; 250/531; 118/723

[56] References Cited

U.S. PATENT DOCUMENTS

| | | | |
|---|---|---|---|
| 4,209,357 | 6/1980 | Gorin et al. | 204/298 |
| 4,230,515 | 10/1980 | Zajac | 156/643 |
| 4,282,077 | 8/1981 | Reavill | 156/643 |
| 4,297,162 | 10/1981 | Mundt et al. | 204/192 E |

*Primary Examiner*—Veronica O'Keefe
*Attorney, Agent, or Firm*—Thomas E. Schatzel

[57] ABSTRACT

A plasma processing chamber incorporating parallel plate electrodes whose separation may be mechanically adjusted from the outside thereof. The chamber includes a sealable assembly including an electrode housing and a reaction chamber body. The body includes an aperture to receive a planar surfaced terminal end of the housing. The aperture is constructed to permit the housing to be easily translated with respect to the body. One electrode surface of the chamber is established on the end of the housing thus received. The other electrode is provided by a corresponding surface within the body. Entry of atmospheric gases into the space between the electrode's surfaces is barred by a sliding, dual, differentially pumped seal between the housing's surface and the aperture's surface. Also incorporated into the processing chamber are four jackscrews aligned parallel to the axis of the housing. These jackscrews, arranged to form a square about the housing, are interposed between the body and a flange projecting radially outward from the housing's terminal end furthest from the body. Synchronous rotation of these jackscrews, provided by a continuous, closed chain passing around sprockets secured to each of the jackscrews, moves the housing with respect to the body thereby altering the electrode's separation. A potentiometer, also driven in synchronism with the jackscrews, permits remote, electronic sensing of electrode spacing.

12 Claims, 4 Drawing Figures

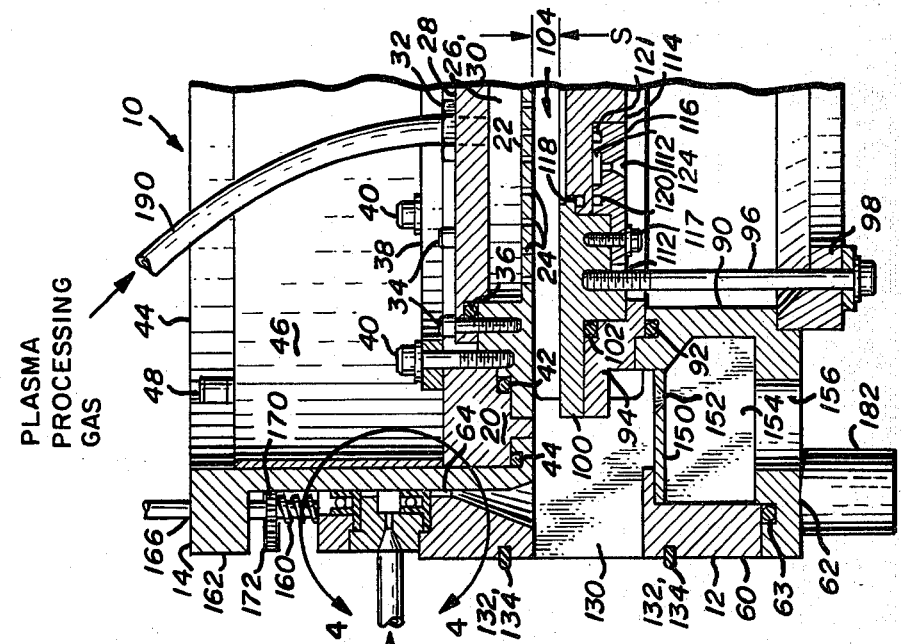
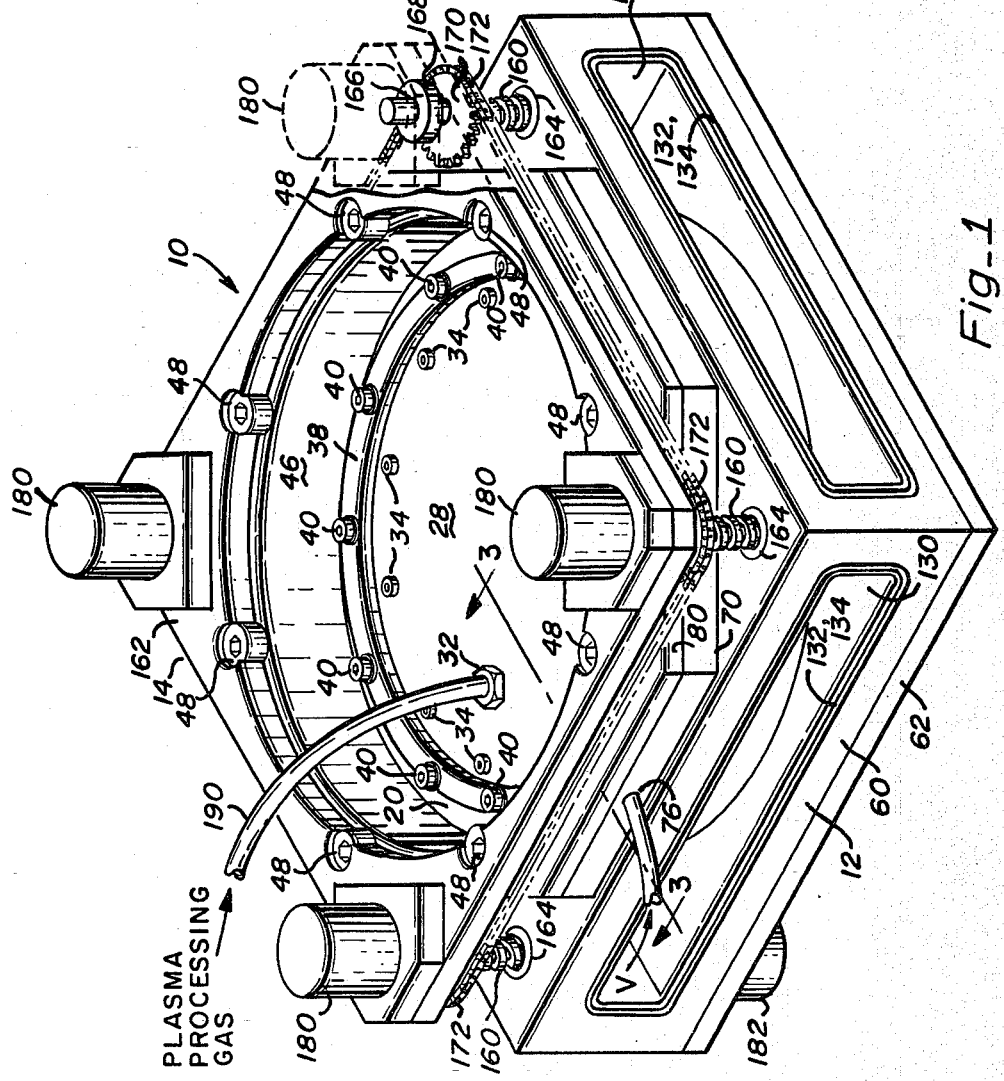

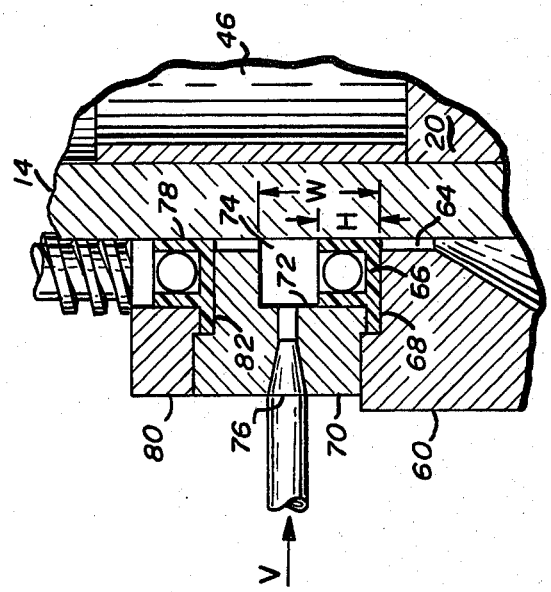
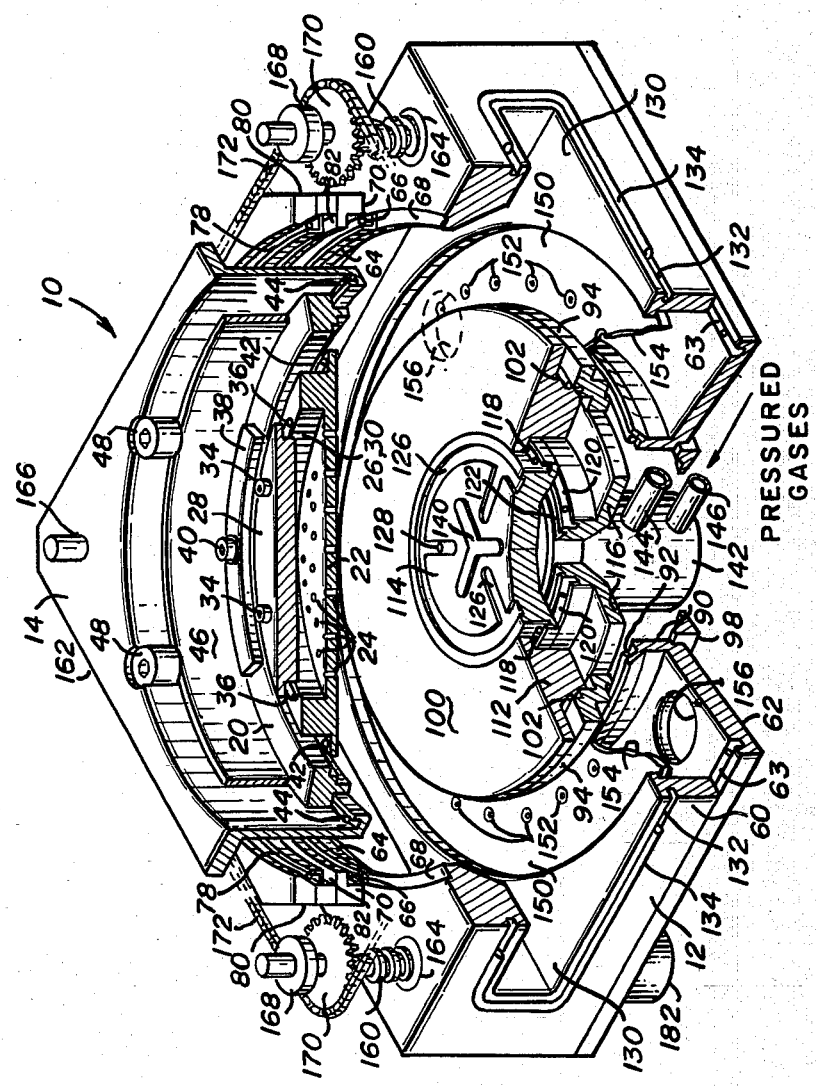

ADJUSTABLE ELECTRODE PLASMA PROCESSING CHAMBER

BACKGROUND OF THE INVENTION

1. Field of the Invention

The invention relates generally to vacuum processing chambers and more particularly to parallel plate plasma processing chambers.

2. Description of the Prior Art

An electrically neutral quantity of highly ionized gas composed of ions, electrons and neutral particles is known as a plasma. Since a plasma contains ions, some of its particles are in an elevated energy state and the excess energy which they possess may be transferred either or both to other matter in the plasma or to solid objects contacted thereby. Depending upon the atomic and/or molecular composition of the plasma, its energy, its density, the composition of the material which it contacts and other factors, this energy transfer may occur either through mechanical collision of energetic particles, by chemical reaction between or among particles or by a combination of mechanical collision and chemical reaction. Depending upon the precise nature of the plasma and the configuration of the chamber in which it is formed, these processes may either deposit or remove material from the surface of solid objects contacted by the plasma. For this reason it has been recognized for some time that plasmas may be exploited in manufacturing processes to mechanically and/or chemically alter the surface of a workpiece.

If a plasma interacts with a solid object solely through mechanical collisions, such as occurs in a chemically inert plasma as might be established in argon gas, the process is generally referred to as sputtering. In sputtering, atoms are removed from a solid surface by accelerated gas ions much like in a billiard ball fashion by striking the surface and ejecting material therefrom. After a collision, both the incident particle and the ejected material respond independently to the forces to which they are respectively subjected. For this reason there is no need to replenish or renew the gas in which the sputtering plasma is established except as necessary to maintain the purity of the inert gas in the plasma and to sweep away gaseous ejecta.

If, alternatively, the plasma is established in a gas containing chemically reactive species and the plasma interaction occurs primarily through a chemical reaction between particles, the process is generally referred to as either plasma etching or plasma deposition depending upon the net effect produced on a workpiece's surface. Generally, a plasma etching process is designed so that the products of the reaction between the gas of the plasma and the surface of the workpiece remain in the gaseous state. Conversely, a plasma deposition process is designed so that the product of the chemical reaction condenses to the solid state on the surface of the workpiece. Thus, because the chemical composition of the plasma changes as the reaction proceeds, the gas being energized into the plasma state usually flows continuously through the reaction region of the chamber in which the plasma is formed. This flow of gas serves both to constantly replenish the supply of unreacted atoms and/or molecules and to carry off the waste products of the reaction. While a plasma process may be designed to optimize a chemical reaction occurring therein, it is virtually impossible to totally eliminate the mechanical process of sputtering if the plasma contacts the surface of solid material.

In the semiconductor fabrication industry, etching is routinely employed as a fabrication process to establish patterns which delineate the various surface regions of a semiconductor component or integrated circuit. The lines and spaces of the pattern to be established in the surface of a semiconductor workpiece during its fabrication are generally first defined by coating that surface with a film of radiation sensitive material generally referred to as photoresist. This film is then exposed to radiation such as light, x-rays or electron-beams having the desired pattern to form a latent image therein. The latent image thus established in the film is then developed in much the same fashion as lithographic plates are processed in the printing industry. Development of the latent image results in the formation of open areas in the film. When this patterned surface of the semiconductor workpiece is subsequently exposed to an environment which preferentially removes material underlying the open areas, the covered regions remaining unattacked become raised above the surrounding etched regions. Historically, the semiconductor industry has employed wet chemical etching to perform this process.

Recently, plasma etching has been increasingly adopted as a manufacturing process in the semiconductor industry because of its ability to produce fine line geometries needed to delineate the components of large scale integrated circuits. The geometric advantage of plasma etching over wet chemical etching occurs because anisotropic plasma etching reactions can be obtained, i.e. plasma processes may be designed in which the etch rate perpendicular to the workpiece surface exceeds the etch rate parallel thereto. This relatively lower lateral etch rate reduces the photoresist undercutting typical of isotropic wet etching processes. In addition, because plasma etching is based primarily upon the chemistry of the gases in which the plasma is formed and their reaction with the surface of the workpiece, it is possible to alter plasma parameters to produce a continuous transition between anisotropic and isotropic etching. Furthermore, by controlling the ion energy and density of the plasma, most plasma etching systems can employ both plasma etching and sputtering to remove material from the surface of a workpiece. Such processes combining both chemical and physical processes for material removal, generally referred to as reactive ion etching, allow significantly greater control over the widths of lines and profiles of their edges than obtainable from wet etching. Thus, by proper control of plasma processing parameters it is possible to sequentially pass from an anisotropic to an isotropic etch or conversely and thereby to control the slope of an etched wall.

Two types of plasma processing chambers, barrel or parallel plate, are generally used for semiconductor etching. In barrel type plasma processing chambers, disk-shaped semiconductor wafers are positioned so that their planar surfaces are aligned perpendicular to and displaced along the central cylindrical axis of a barrel-shaped reaction chamber. A radio frequency electrical current is then coupled into the gas within the processing chamber by means of a plurality of electrodes located around and just within the cylindrical outer surface of the chamber. The chemically active species generated within plasma established by this electrical current, initially located around the periphery of the processing chamber, then diffuse through a perforated etch tunnel wall surrounding the parallel wafers to reach reaction sites on their surfaces. However, since barrel type plasma etchers generally produce isotropic etching reactions they are unsuited to high density, small feature integrated circuit fabrication. Alternatively, parallel plate etching chambers in which the planar surface of a wafer is positioned parallel to and between parallel planar electrodes may be operated so as to produce anisotropic etching. Anisotropic etching may be obtained from parallel plate chambers because the electrical field associated with the radio frequency current flowing between the parallel electrodes imparts a directional aspect to the reactants created within the plasma.

Generally, parallel plate plasma processing chambers have been constructed by securing opposing electrically insulated parallel plates within the walls of a much larger vacuum chamber. These plates are then electrically connected to a radio frequency current generator located outside the chamber. This chamber is further provided with a means for controlled admission of the reactant gas with the waste products of the reaction generally being removed by a vacuum pump. After assembly, such a chamber must first be mechanically adjusted for proper operation. In particular, the parallelism of the plates must be adjusted to produce uniform etching across the surface of a wafer and the spacing must be adjusted to obtain efficient operation of the plasma reaction. Adjustment of these plates is generally difficult and awkward. In general, adjustment of plate spacing involves evacuating the chamber, establishing a plasma therein, determining that the spacing is incorrect, extinguishing the plasma, breaking vacuum on the chamber and then changing the plate spacing which, of course, generally entails some risk of adversely affecting the adjustment of plate parallelism. After each adjustment has been made, the first portion of this procedure must be repeated to determine whether the adjustment was made correctly. If an unsatisfactory adjustment was made, the remainder of the procedure must be repeated so that a plate spacing may be further altered. The process for adjusting plate parallelism is similar to that for plate spacing.

In addition to being difficult to adjust, plasma processing chambers constructed in the foregoing manner also exhibit other undesirable characteristics. In such a chamber, the region in which the plasma is formed may include not only the region immediately between the parallel plates but also may include the opposite sides, i.e. backsides, of the plates. A plasma having such an extent can exhibit a phenomenon known as "backside sputtering" wherein material is removed from the backside of the parallel plates. Material thus removed from the backsides of the plates may have a deleterious effect on the plasma reaction and/or may be deposited on the surface of the workpiece. Furthermore, existence of a plasma extending beyond the region immediately between the parallel plates, even if it does not result in deleterious backside sputtering, indicates that radio frequency energy being supplied to the processing chamber is being wasted thus reducing the efficiency of the etching process.

SUMMARY OF THE PRESENT INVENTION

An object of the present invention is to provide a sealable, parallel plate plasma processing chamber having electrodes whose separation distance may be adjusted from outside the chamber.

Another object is to provide a plasma processing chamber which may be easily adapted to differing plasma processes.

Another object is to provide a parallel plate plasma processing chamber having adjustable electrodes in which electrode parallelism is maintained while electrode separation distance is altered.

Another object is to provide a parallel plate plasma processing chamber having adjustable electrodes which do not exhibit backside sputtering.

Another object is to provide a parallel plate plasma processing chamber wherein a larger fraction of the energy supplied thereto is applied to processing plasma generation.

Another object is to provide an adjustable electrode, parallel plate plasma processing chamber having temperature control of the electrode which may be contacted by a workpiece.

Another object is to provide an adjustable electrode, parallel plate plasma processing chamber capable of laminar flow of the processing plasma.

Briefly, in a preferred embodiment, the single wafer, parallel plate plasma processing chamber of the present invention includes a sealable assembly made up of a square-shaped reaction chamber body and a cylindrically-shaped electrode housing. One terminal end of this cylindrical housing is closed by a sealed, planar, circular surface formed perpendicular to the housing's cylindrical axis. This surface is itself composed of a central, disk-shaped, electrically conductive region surrounded by an electrically insulated ceramic ring. The electrically conductive central region, which serves as both a chamber wall and as one of the parallel plate electrodes, is pierced by a large plurality of small holes. A plenum is formed in this disk-shaped central region behind the planar end surface of the electrode housing by means of a recess formed into the backside of the central disk-shaped region. This recess is sealed from the surrounding atmosphere by a disk-shaped plenum cover plate secured thereto. A processing gas inlet, formed through this cover plate, permits the infusion of plasma processing gases into this plenum and hence into the plama processing chamber. This combination of the plenum and the perforated electrode surface adapts this closed planar terminal end of the electrode housing to admit a laminar flow of processing gases into the plasma processing chamber.

The perforated terminal end of the electrode housing is received by a cylindrically-shaped electrode housing aperture formed into the top wall of the square-shaped reaction chamber body. This aperture is formed with a diameter slightly larger than that of the electrode housing so that the received housing may be easily moved longitudinally parallel to its cylindrical axis with respect to the chamber body. The surface of this aperture has an L-shaped trough formed therein immediately adjacent to the upper surface of the reaction chamber body so as to form an outer ring-shaped trough about the received electrode housing. An outer ring-shaped seal is secured in this trough in order to contact and seal between the surfaces of the received electrode housing and the electrode housing aperture. A second, inner, ring-shaped trough, also formed into the surface of the electrode housing is aligned parallel to and adjacent to the outer trough. This inner trough is formed to have a U-shaped cross section whose width parallel to the received electrode housing is greater than the height of an inner ring-shaped seal which is secured therein. As with the outer seal, this inner seal contacts and seals between the surfaces of the received electrode housing and the electrode housing aperture. Within the width of the oversized inner trough, the inner seal is positioned furthest from the outer seal thus establishing an open, ring-shaped chamber between the outer and inner seals. This ring-shaped chamber, which encompasses the surface of the received electrode housing, may be evacuated by means of vacuum applied thereto through an aperture formed from the inner trough through the wall of the reaction chamber body.

Projecting from the interior surface of the wall of the reaction chamber body immediately opposite to the electrode housing aperture is a cylindrically shaped pedestal having a planar circular terminal end surface. This end surface is formed to be parallel to the planar terminal end of the received electrode housing, to have the same diameter as that of the perforated electrode region of the electrode housing and to be aligned therewith. Thus, this surface constitutes the second parallel plate electrode of the processing chamber and positioning the perforated electrode immediately adjacent thereto establishes a plasma reaction region in the space between their surfaces. In the preferred embodiment of this invention especially adapted to process disk-shaped workpieces such as semiconductor wafers, the pedestal's surface has a network of U-shaped troughs formed into its surface to which vacuum may be applied in order to secure a workpiece rigidly to the surface of the pedestal. Formed within the wall of the reaction chamber body immediately adjacent to the workpiece recess is a horseshoe-shaped chamber through which may flow temperature controlled liquid. Establishing such a flow permits control of the electrode's temperature and consequently temperature control of a workpiece contacting it.

Workpieces may be received onto or removed from the processing chamber through any one of four rectangular workpiece transfer apertures respectively formed through the side walls of the square-shaped body. In the preferred embodiment of this invention, it is intended that the apertures actually used for workpiece transfers are to be closed by loadlocks secured to the appropriate side surfaces of the body. Those loadlocks may be of the type described in the concurrent patent application entitled "Modular Loadlock" and assigned to the same assignee as the present application. Alternatively, it is intended that workpiece transfer apertures not to be used for that purpose are to be closed by flat plates similarly secured to the appropriate side surfaces of the body. So adapted, the plasma processing chamber of this invention may be closed and sealed while containing a workpiece within the plasma reaction region established by the two adjacent electrode surfaces.

Surrounding the pedestal intermediate the electrode surface at the terminal end thereof and the wall of the reaction chamber body from which the pedestal projects, is a planar, annular-shaped flow equalizer plate. The planar surface of this plate is aligned parallel to the electrode surface of the pedestal while its circular side surfaces respectively seal to the pedestal's side surface and the inner surface of the reaction chamber body's side walls. Formed through the body's wall from which the pedestal projects are two diametrically opposed reaction chamber exhaust apertures for removing processing gases from the plasma reaction region. To allow processing gases to flow from the plasma reaction region to the exhaust apertures, the flow equalizer plate is perforated by a plurality of holes spaced uniformly about the circumference of a circle concentric with the pedestal's electrode surface. Thus, this equalizer plate assures that the flow of processing gases from the plasma reaction region to the exhaust apertures is uniformly distributed about the circumference of the pedestal's electrode surface.

The processing chamber of this invention further includes four jackscrews aligned parallel to the cylindrical axis of the electrode housing. These jackscrews are interposed between the reaction chamber body surrounding the electrode housing aperture and a square-shaped flange projecting radially outward from the terminal end of the housing's surface furthest from the reaction chamber body. The jackscrews are arranged in a square about the electrode housing aperture being positioned between the corners of the reaction chamber body and the electrode housing's flange. The threads on the jackscrews are engaged by threaded nuts recessed into the reaction chamber body. The terminal end of the jackscrews furthest from the reaction chamber body respectively pass through apertures formed in the electrode housing's flange. Bearings are secured about the jackscrews to mate with the apertures in the housing's flange in order to reduce the frictional engagement therebetween. Thus, synchronous rotation of these jackscrews may either urge the housing to move away from the reaction chamber body against the combined forces of gravity and atmospheric pressure or permit it to move inward responsive to these combined forces. Such motion of the electrode housing alters the distance between the electrode surfaces of the housing and the reaction chamber body while maintaining the parallelism therebetween. To facilitate synchronous rotation, a sprocket is respectively secured about each of the jackscrews intermediate the nut in the reaction chamber body and the bearing at the electrode housing's flange. A continuous, closed chain passes around these four sprockets engaging their teeth thereby mechanically forcing the jackscrews to rotate in unison. A bidirectional electric motor is respectively secured to the terminal end of each of the jackscrews projecting above the electrode housing's flange. Simultaneously energizing all four of these motors thus causes the four jackscrews to rotate synchronously. A rotary potentiometer, mounted beneath one corner of the reaction chamber body and coupled to one of the jackscrews permits electronic sensing of electrode spacing.

The parallel plate plasma processing chamber constructed in the foregoing manner is prepared for operation by securing either loadlocks or sealing plates about all of its workpiece transfer apertures. At least one of these apertures must be sealed with a loadloack so that a workpiece may be delivered into and removed from the plasma processing region. A supply of processing gases is connected to the gas inlet aperture formed through the cover plate of the electrode housing by means of an insulating tube. A radio frequency power supply incorporating an impedance matching network is also connected between the cover plate and body. Because of the structure of the electrode housing, the impedance matching network of the radio frequency power supply may be located immediately adjacent to the cover plate, i.e. the reverse side of the insulated electrode. This close physical proximity between the matching network and the plasma reaction region permits construction of a matching network which closely matches the processing chamber's electrical characteristics. The ability to achieve such close electrical matching permits efficient coupling of radio frequency energy into processing plasma generation. Lastly, vacuum is applied to both the ring-shaped chamber between the outer and inner seals and to the reaction chamber exhaust apertures of the reaction chamber body. Preferably separate vacuum systems are connected respectively to the ring-shaped chamber and to the reaction chamber exhaust apertures so that atmospheric gases pumped from the ring-shaped chamber are not mixed with spent processing gases.

With the processing chamber thus prepared, workpiece is then loaded into the plasma processing region within the processing chamber and sealed therein. Processing gasses are then caused to flow from the gas inlet aperture through the plasma reaction region and out of the plasma processing chamber through the exhaust aperture. Simultaneously, a radio frequency current is supplied to the plasma reaction region by a radio frequency electrical potential applied between the reaction chamber body and the electrically conductive central region of the electrode housing. The flow of gasses, the quantity of radio frequency energy, and the electrode spacing are then adjusted to establish the desired plasma processing conditions in the plasma reaction region between the electrodes. Due to the structure of the electrically conductive central region of the electrode housing and the electrically insulating tubing used to conduct the processing gases thereinto, no plasma is generated on the backside of this electrode. Thus, the radio frequency energy being supplied to this electrode is consumed only in the plasma reaction region between the parallel plates. Once processing has been completed, the supply of radio frequency energy may be turned off, and the workpiece may be removed from the chamber through a loadlock.

An advantage of the parallel plate plasma processing chamber of the present invention is that it incorporates electrodes whose separation distance may be adjusted from outside the chamber.

Another advantage of the parallel plate plasma processing chamber is that it may be easily adapted to differing plasma processes.

Another advantage of the plasma processing chamber is that electrode parallelism is maintained while electrode separation distance is altered.

Another advantage is that the electrodes of the parallel plate plasma processing chamber do not exhibit backside sputtering.

Another advantage of the parallel plate plasma processing chamber is that a larger fraction of the energy supplied thereto is coupled into the processing plasma.

Another advantage of this parallel plate plasma processing chamber is that the temperature of the workpiece electrode may be controlled.

Another advantage of this parallel plate plasma processing chamber is that the plasma may be adjusted to have a laminar, radially outward flow.

These and other objects and advantages of the present invention will no doubt become obvious to those of ordinary skill in the art after having read the following detailed description of the preferred embodiment as illustrated in the various drawing figures.

IN THE DRAWING

FIG. 1 is a perspective view of a plasma processing chamber in accordance with the present invention;

FIG. 2 is a partially sectioned perspective view of the plasma processing chamber of FIG. 1;

FIG. 3 is a cross-sectional view of the plasma processing chamber taken along the line 3—3 of FIG. 1 showing the mating of the electrode housing to the reaction chamber body; and FIG. 4 is a cross-sectional view of the seal between the reaction chamber body and the electrode housing taken along the line 4—4 of FIG. 3.

DETAILED DESCRIPTION OF THE PREFERRED EMBODIMENT

FIGS. 1 to 3 show a sealable, single wafer, parallel plate plasma processing chamber in accordance with the present invention and referred to by the general reference character 10. The plasma processing chamber 10 has a reaction chamber body 12 for receiving a right circular cylindrically shaped electrode housing 14. The received terminal end of the electrode housing 14 is sealed by an annular-shaped, ceramic insulating ring 20 surrounding a disk-shaped electrically conductive electrode 22. The planar surfaces of the ring 20 and the electrode 22 are aligned perpendicular to the cylindrical axis of the electrode housing 14. The planar surface of the electrode 22 is pierced by a large plurality of small, regularly spaced apertures 24 formed to permit the passage of gas therethrough. In the preferred embodiment of this invention, the apertures 24 are circularly shaped, having an approximately 0.03125-inch diameter and are located at the vertices of a regular hexagonal polygonal grid having a distance of approximately 0.250 inch between the nearest neighboring holes on the grid. The side of the disk-shaped electrode 22 opposite to the planar surface pierced by the apertures 24 is formed with a circularly-shaped recess 26. The recess 26 is closed by a disk-shaped, electrically conductive plenum cover plate 28, thereby establishing a plenum 30 therebetween. The plenum cover plate 28 is pierced by a plasma processing gas inlet 32 for admitting plasma processing gas to the plenum 30. The electrically conductive electrode 22 and the plenum cover plate 28 are rigidly secured to each other by a plurality of fasteners 34 and contact an O-ring 36 in order to seal the plenum 30. The plenum cover plate 28 is precisely formed to contact the electrically conductive electrode 22 about its periphery, thus providing a low-resistance, electrically-conductive path from the plate 28 to the electrode 22. Thus, any electrical potential applied to the plate 28 is simultaneously applied to the electrode 22. The electrode 22 is secured to the lower surface of the insulating ring 20 by means of a clamping ring 38 contacting the upper surface of the insulating ring and a plurality of fasteners 40. The electrode 22 is sealed to the insulating ring 20 by an O-ring 42 located between their respective upper and lower surfaces. The insulating ring 20 is sealed to the electrode housing 14 by an O-ring 44 therebetween and is mechanically secured thereto by means of an annularly-shaped clamping sheet 46 contacted along its upper edge surface by a plurality of fasteners 48.

The reaction chamber body 12 includes a square-shaped body 60 whose lower surface is closed and sealed by a base plate 62 and an O-ring 63 disposed therebetween. The upper surface of the body 60 has a cylindrically-shaped electrode housing aperture 64 formed to loosely receive the electrode housing 14 thus allowing it to easily translate parallel to its cylindrical axis with respect to the body 60.

Referring now to FIG. 4, an inner, ring-shaped seal 66 is secured between the body 60 and the electrode housing 14 and clamped within an L-shaped trough 68 by a first clamping plate 70. The circularly-shaped inner surface of the clamping plate 70 is formed to establish a U-shaped trough 72 having a width "W" which is greater than the height "H" of the seal 66 thereby establishing a ring-shaped chamber 74 in the unoccupied space thereof surrounding the electrode housing 14. Vacuum may be applied to the chamber 74 by means of a vacuum port 76 formed through a wall of the first clamping plate 70. An outer ring-shaped seal 78, identical to the inner ring-shaped seal 66, is clamped by a second clamping plate 80 within an L-shaped trough 82 formed in the upper surface of the first clamping plate 70. The identical inner seal 66 and outer seal 78 which seal between the reaction chamber body 12 and the electrode housing 14 may be of a type manufactured by Bal-Seal Corporation of Pasadena, Calif.

Referring now to FIG. 2, the base plate 62 is formed to have a ring-shaped pedestal 90 which projects upward within the body 60. Contacting the upper surface of the pedestal 90 and sealed thereto by an O-ring 92 is a spacer ring 94. The spacer ring 94 is urged to seal with the pedestal 90 by means of a clamping force applied thereto by fasteners 96, shown in FIG. 3. The fasteners 96 connect a lower clamping ring 98 to a second, planar, disk-shaped electrode 100. A seal is established between the disk-shaped electrode 100 and the spacer ring 94 by an O-ring 102. The electrically conductive electrode 22 and the second, disk-shaped electrode 100 are formed with the same diameter and are aligned within the assembled plasma processing chamber 10 so their adjacent surfaces are parallel and their centers are colinear. Thus formed and positioned, the immediately adjacent planar surfaces of the electrodes 22 and 100, as shown in FIG. 3, are separated by a distance "S" and thereby establish a plasma reaction region 104 therebetween.

Referring again to FIG. 2, the second electrode 100 is a composite structure which includes a ring-shaped plate 112 surrounding a disk-shaped vacuum chuck 114. The vacuum chuck 114 is clamped to the ring-shaped plate 112 by means of a temperature control ring 116. The ring 116 projects upward into the ring-shaped plate 112 beneath the chuck 114 and is secured to the plate 112 by fasteners 117. The vacuum chuck 114 is sealed to the ring-shaped plate 112 by an O-ring 118 and the temperature control ring 116 is sealed to the vacuum chuck 114 by a pair of O-rings 120 and 121, shown in FIG. 3. Formed into the surface of the temperature control ring 116 immediately adjacent to the vacuum chuck 114 is a circular, horseshoe-shaped trough 122. Formed through the wall of the temperature control ring 116 respectively at each terminal end of the horseshoe-shaped trough 122 are temperature control fluid apertures 124. Referring again to FIG. 2, formed into the exposed surface of the chuck 114 are U-shaped troughs 126. Placing an essentially planar surface of a workpiece such as a disk-shaped semiconductor wafer over the troughs 126 isolates them from the rest of the processing chamber 10. Thus, vacuum may be applied to the troughs 126 from outside the processing chamber 10 through an aperture 128 formed through the chuck 114 to secure such a workpiece thereto.

To permit delivery and removal of a workpiece from the processing chamber 10, rectangular workpiece transfer apertures 130 are formed through each planar side surface of the square-shaped body 60. A U-shaped trough 132, formed into the surface of the body 60 about each workpiece transfer aperture 130, and an O-ring 134 retained therein permits sealing the aperture 130 with either a flat plate or a loadlock. That loadlock may be of the type described in the concurrent patent application entitled "Modular Loadlock" Ser. No. 234,367 filed Feb. 13, 1981 and assigned to the same assignee as the present application. The subject matter of that application is incorporated herein by reference for purposes of completely describing the manner of using the plasma processing chamber 10 of the present invention. The electrode 100 is adapted to receive a disk-shaped workpiece such as a semiconductor wafer delivered thereover by three-arm, triangularly-shaped elevator 140 located at the center of and recessed into the surface of the vacuum chuck 114. The elevator 140 includes a shaft (not shown) which projects downward through an aperture (also not shown) in the center of the vacuum chuck 114. The shaft of the elevator 140 is connected to a pneumatic cylinder 142 located within the hollow central portion of the pedestal 90 beneath the vacuum chuck 114. The pneumatic cylinder 142 and the shaft of the elevator 140 are sealed to the vacuum chuck 114 to prevent entry of atmospheric gases into the plasma processing chamber 10. The pneumatic cylinder 142 includes pressurized gas inlet ports 144 and 146 by which it may be energized. Thus, by supplying a flow of pressurized gas to the port 144 or 146, the elevator 140 may either be raised above the surface of the electrode 100 or retracted into the recess therefor in the vacuum chuck 114.

Secured between the inner surface of the body 60 and the outer surface of the pedestal 90 is planar, annular-shaped flow equalizer plate 150 having formed therethrough a circular ring of uniformly spaced apertures 152. The planar surface of this plate is aligned parallel to the planar surface of the electrode 100 while its circular side surfaces respectively seal to the pedestal 90 and the body 60. Thus, a chamber 154 is established between the body 60 and the base plate 62 which is separated from the plasma reaction region 104 by the flow equalizer plate 150. Formed through the base plate 62 are diametrically opposed exhaust apertures 156 for removing processing gases from the chamber 154 and hence the plasma reaction region 104. The apertures 152, formed through the flow equalizer plate 150, are spaced uniformly about the circumference of a circle concentric with the electrode 100 to assure that the flow of processing gases from the plasma reaction region 104 is uniformly distributed about the circumference thereof.

The plasma processing chamber 10 is adapted to permit adjustment of the spacing "S" between the electrodes 22 and 100 by means of four jackscrews 160. The jackscrews 160 are respectively interposed between a corner of the square-shaped body 60 and a corner of a square-shaped flange 162 projecting outward from the upper terminal end of the electrode housing 14. The threads of the jackscrews 160 are engaged by nuts 164 recessed into the body 60. The terminal end of the jackscrew 160 farthest from the body 60 passes through an aperture 166 formed through the flange 162. Frictional engagement between the jackscrew 160 and the flange 162 is reduced by bearings 168 interposed therebetween. Respectively secured about each of the jackscrews 160 intermediate the bearing 168 and the nut 164 is a toothed sprocket 170. The toothed sprockets 170 are secured to the jackscrews 160 to be co-planar and to engage a continuous, linked chain 172 passing there-around. Thus, linear motion of the chain 172 causes synchronous rotation of the jackscrews 160. The parallelism of the electrodes 22 and 100 may be adjusted from without the plasma processing chamber 10 by adjusting the angular relationship among the jackscrews 160. Once established, that parallelism is maintained while adjusting the spacing "S" by locking the jackscrews 160 into synchronous rotation with the sprockets 170 and the chain 172. Synchronous rotation of the jackscrews 160 may either urge the electrode housing 14 to translate away from the reaction chamber body 112 against the combined forces of gravity and atmospheric pressure or permit it to translate inward responsive to these combined forces.

Referring to FIG. 1, rotary motion is induced in each of the jackscrews 160 by means of an electric motor 180 respectively secured at each of the corners of the flange 162. Thus, each jackscrew 160 is powered by the motor 180 coupled thereto while the sprockets 170 and the chain 172 assure synchronous rotation of all four jackscrews 160. The angular position of the jackscrews 160 and consequently the separation distance "S" between the electrodes 22 and 100 about the plasma reaction region 104 is sensed by means of a rotary potentiometer 182 secured beneath the base plate 62. The potentiometer 182 is preferably located beneath the reaction chamber body 12 to reduce the electrical noise induced therein when applying radio frequency alternating currents to the electrodes 22 and 100. Secured in this location, the rotary potentiometer 182 must be connected to the jackscrew 160 by means of an extensible rotary coupling (not shown) because of the relative linear motion between the potentiometer 182 and the jackscrew 160 when it rotates.

After the processing chamber 10 has been assembled, the parallelism of the electrodes 22 and 100 must be established. Further, a correlation must be established between the electrical resistance of the potentiometer 182 and the separation distance "S" between the electrodes 22 and 100. Both these adjustments are accomplished by first bringing the electrodes 22 and 100 into full contact so they are parallel. Then the angular relationships among the jackscrews 160 is adjusted to assure that the surfaces of the electrodes 22 and 100 will remain parallel when separated. Thus, the accuracy with which the parallelism of the electrodes 22 and 100 is maintained is limited solely by the mechanical precision of the jackscrews 160. After the jackscrews 160 have been adjusted, the resistance of the potentiometer 182 is set to some specified value. Subsequent measurement of the separation distance "S" once the electrodes 22 and 100 are separated is made by measuring the electrical resistance of the potentiometer 183. Thus, the accuracy with which the separation distance "S" may be measured is limited by the combined precision of the mechanical elements of the plasma processing chamber 10 such as the jackscrews 160 and by the electrical precision of the potentiometer 182.

The plasma processing chamber 10 is prepared for operation by placing a disk-shaped workpiece such as a semiconductor wafer on the vacuum chuck 114. Such a workpiece may be secured to the electrode 100 by applying a vacuum to the chuck 114. The workpiece transfer apertures 130 are then closed and sealed while vacuum is applied to the chamber 10 through the exhaust apertures 156 and the chamber 74 through the vacuum port 76. Simultaneous with the application of vacuum, a flow of plasma processing gas flows into the plenum 30 through a length of electrically insulating teflon tubing 190 connected to the processing gas inlet 32. This gas flows from the plenum 30 into the plasma reaction region 104 through the plurality of apertures 24 formed in the electrode 22. A large number of small, regularly spaced apertures 24 are used for this purpose in order to establish a uniform radial outward flow of processing gas across the surface of the electrode 100 which flow may be laminar under appropriate flow conditions. The processing chamber 10, thus sealed enclosing a workpiece and having a flow of processing gas passing through the plasma reaction region 104, is then provided with a radio frequency alternating electrical potential impressed between the electrode 22 and the reaction chamber body 12. Since all the structural elements of the processing chamber 10 other than the insulating ring 20 are electrically conductive, imposition of this radio frequency alternating electrical potential induces an electric current between the surfaces of the electrodes 22 and 100. This current establishes a plasma in the gas within the plasma reaction region 104. No corresponding plasma is established on the back side of the electrode 22 because there is no difference in electrical potential between it and the plenum cover plate 28. No plasma is established at the outer surface of the plenum cover plate 28 because it is exposed to atmospheric pressure and none is developed within the tube 190 because of its length and because it is electrically insulating. Thus, the plasma processing chamber 10 cannot exhibit backside sputtering.

Having established a plasma within the plasma reaction region 104, the spacing "S" between the electrodes 22 and 100 adjacent thereto may now be varied by applying electric currents to the motors 180. By appropriately controlling the currents applied to the motors 180, the plasma processing conditions within the region 104 may be adjusted from without the chamber 10 while it is operating. The temperature of the vacuum chuck 114 and consequently the temperature of a workpiece in intimate contact therewith may be controlled by passing a flow of temperature controlled liquid through the horseshoe-shaped trough 122.

The plasma processing chamber 10 may be employed to etch a wide variety of materials with a corresponding variety of processing gasses. Depending upon the type of material to be etched and the desired resultant etch characteristics, different processing parameters such as the composition, pressure and flow rate of the processing gas, the separation distance "S" between the electrodes 22 and 100 and the radio frequency energy power density within the plasma must be experimentally determined. Since the exact chemical character of the material to be etched and of the processing gasses affect the values determined for these parameters, values established for a material prepared for etching by one process may be different from those for etching the same material prepared by a different process. Thus, it is impossible to precisely establish the best manner of operating the plasma processing chamber 10 without performing experiments with the actual workpieces and processing gasses to be used. The processing gas may be a mixture of 90 percent carbon tetraflouride, $CF_4$, and 10 percent molecular oxygen, $O_2$, admitted into the processing chamber 10 at a pressure of one Torr and at a flow rate of 100 standard cubic centimeters per minute when etching the surface of a 100-milimeter-diameter wafer. A plasma may then be formed in this processing gas mixture by supplying radio frequency energy at a power density of approximately one watt per square centimeter of electrode surface area between the surfaces of the electrodes 22 and 100 separated by a distance "S" of 0.5 centimeter.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. An adjustable electrode plasma processing chamber comprising:
a sealable assembly including an electrode housing having a first electrode formed at one terminal end thereof and a reaction chamber body having formed therein a second electrode and an aperture for receiving and sealing about said first electrode terminal end of said electrode housing, said electrodes being electrically insulated from one another and positioned adjacent to one another to establish a plasma reaction region between adjacent surfaces thereof, said electrode housing and said reaction chamber body being moveable with respect to each other for changing said separation distance of said adjacent surfaces of said electrodes, the assembly being adapted to receive a workpiece within said plasma reaction region, the assembly further including a workpiece transfer aperture to allow a workpiece to enter or exit the plasma reaction region, a processing gas inlet aperture for infusing plasma processing gases into the plasma reaction region and an exhaust aperture for removing gases from the plasma reaction region; and
an electrode positioning means for moving said electrode housing with respect to said reaction chamber body whereby said separation distance between adjacent surfaces of said electrodes may be controlled, the positioning means being operable from outside the sealed plasma processing chamber.

2. The plasma processing chamber of claim 1 wherein:
said adjacent surfaces of said first and second electrodes are substantially planar and positioned within the assembly with said planar surfaces substantially parallel to one another about said plasma reaction region, said electrodes being moveable with respect to one another in a direction essentially perpendicular to said planar surfaces, said electrode positioning means maintaining said parallelism of said adjacent surfaces of said electrodes when said separation distance thereof is altered.

3. The plasma processing chamber of claim 1 wherein said electrode housing is in the shape of a right circular cylinder and said reaction chamber body is in the shape of a regular polygon, said reaction chamber body having a right circular cylindrically-shaped electrode housing aperture formed therein to receive a first terminal end of said electrode housing so that said electrode housing may be translated parallel to said cylindrical axis with respect to said reaction chamber body, said first terminal end of said housing being formed substantially planar and substantially perpendicular to said cylindrical axis of said housing, said first terminal end further including a central, disk-shaped, electrically conductive region surrounded by a ring-shaped electrically insulating region thus establishing said central disk-shaped region as said first electrode and insulating said first electrode from the remainder of the assembly, said housing further having a flange formed to project radially outward from the second terminal end of the housing furthest from said reaction chamber body, said reaction chamber body having a substantially planar L-shaped trough formed in said surface of said electrode housing aperture to form an outer ring-shaped trough around said received electrode housing, the assembly further including an outer ring-shaped seal secured in said outer trough to establish a seal between said adjacent surfaces of said received electrode housing and said electrode housing aperture, said reaction chamber body further having a substantially planar U-shaped inner trough formed in said surface of said electrode housing aperture about said received electrode housing, said inner trough being located inward along said surface of said electrode housing aperture toward said plasma reaction region from said outer trough, the assembly further including an inner ring-shaped seal secured in said inner trough to establish contact with and seal between said adjacent surfaces of said received electrode housing and said electrode housing aperture, said inner trough being formed to have a width parallel to said cylindrical axis of said housing aperture which is greater than said height of said inner seal, said inner seal being positioned inward within said oversized inner trough toward said plasma reaction region from said outer trough whereby a chamber is established in said portion of said inner trough unoccupied by said inner seal, said assembly being further adapted to permit evacuation of said chamber thus established, said reaction chamber body further having a disk-shaped surface formed therein having substantially the same diameter as the diameter of the first electrode, said disk-shaped surface being disposed adjacent to, parallel to and aligned with the first electrode located at the first terminal end of a received electrode housing thereby establishing said second electrode.

4. The plasma processing chamber of claim 3 wherein the electrode positioning means includes a plurality of jackscrews, said jackscrews being disposed to have said longitudinal axes thereof aligned substantially parallel to said cylindrical axis of said electrode housing, said jackscrews being further positioned about the electrode housing and interposed between said reaction chamber body and said flange of said electrode housing, the positioning means also including an equal plurality of toothed sprockets, one of said sprockets being rigidly secured respectively about each of said jackscrews so said sprockets are essentially coplanar and so said plane of said teeth is aligned substantially perpendicular to said longitudinal axis of said jackscrews, the positioning means also including a continuous, closed chain passing around said four sprockets and engaging said teeth thereof whereby said jackscrews are constrained to rotate in unison, the positioning means further including means for inducing longitudinal motion in said chain.

5. The plasma processing chamber of claim 4 further comprising
a potentiometer driven in synchronism with said rotation of said jackscrews for sensing said separation distance of said surfaces of said electrodes.

6. The plasma processing chamber of claim 1 further comprising
means for sensing said separation distance of said electrode surface, from outside the assembly when the assembly is sealed.

7. The plasma processing chamber of claim 1 further comprising
a workpiece holding means for rigidly securing a received workpiece within said plasma reaction region.

8. The plasma processing chamber of claim 7 wherein the workpiece holding means rigidly secures a received workpiece to one of said electrodes.

9. The plasma processing chamber of claim 8 wherein the workpiece holding means is adapted to secure a substantially planar surface of a received workpiece to one of said electrodes by means of a vacuum chuck formed on the surface thereof.

10. The plasma processing chamber of claim 1 wherein
one of said electrodes is adapted so that a workpiece may be received into intimate contact therewith.

11. The plasma processing chamber of claim 9 or 10 further comprising
means for temperature control of said electrode which may be contacted by a workpiece.

12. The plasma processing chamber of claim 1 wherein
one of said electrodes includes a large plurality of small apertures formed therethrough, the plasma processing chamber further comprising:
a plenum established behind said electrode having a plurality of apertures formed therethrough, the plenum being formed on the side of said electrode opposite to said surface thereof immediately adjacent to said plasma reaction region, all surfaces of the plasma processing chamber enclosing the plenum being electrically conductive and electrically connected to said electrode whose surface partially encloses the plenum, said processing gas inlet aperture of the processing chamber being adapted to admit a flow of plasma processing gas into said plenum, said flow of processing gas being conducted to said processing gas inlet aperture through an electrically insulating tube located outside of said plasma processing chamber.

* * * * *